United States Patent Office 3,419,442

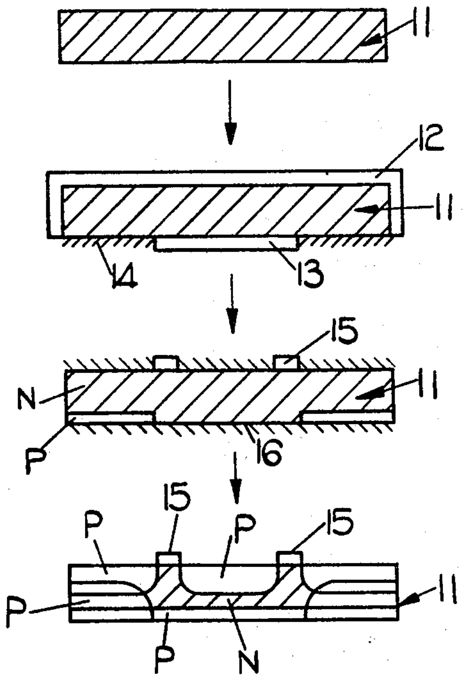
11
12
11
14
13
15
N
11
P
16
15
P
P
15
P
11
P
N

Patented Dec. 31, 1968

3,419,442

SEMICONDUCTOR DEVICES

Charles Peter Cockshott, Coventry, England, assignor to Joseph Lucas (Industries) Limited, Birmingham, England Filed Apr. 26, 1966, Ser. No. 545,284

Claims priority, application Great Britain, May 5, 1965, 18,903/65

3 Claims. (Cl. 148—187)

This invention relates to a method of forming a three-layer semiconductor slice.

A method according to the invention comprises the following steps:

(i) Covering part of one face of a slice of one conductivity type with a first impurity of the opposite conductivity type.

(ii) Subjecting the slice to a diffusion process.

(iii) Covering part of the other face and at least those parts of said one face of the slice not covered by the first impurity with a second impurity of said opposite conductivity type, the second impurity having a slower rate of penetration than the first impurity.

(iv) Subjecting the slice to a further diffusion process to cause impurity to diffuse completely through the slice only in the regions originally covered by the first impurity, so that a three layer slice is produced with all three layers terminating on one face of the slice.

The accompanying drawing is a flow sheet illustrating one example of the invention. Referring to the drawing, it is desired to form a p-n-p slice, and for this purpose an n-type slice 11 is first formed to the required size by known techniques. Masks 12, 13 are then placed on the top face, the side edges of the slice and on a central portion of the lower face of the slice. The unmasked area is then coated with aliminium 14, and the slice is subjected to a short diffusion process to allow the aluminium to penetrate into the slice. The masks 12, 13 are then removed, and replaced by a mask 15 positioned on the top face of the slice so as to enclose a central portion of the slice.

The next step is to produce on both faces of the slice 11, except for the part of the slice covered by the mask 15, a layer 16 of boron. The layers 14, 16 are produced by any convenient known techniques.

The slice is now subjected to a diffusion process for a period of time such that the boron diffusing into the slice from opposite faces does not have time to diffuse completely through the slice. However, aluminium diffuses more quickly than boron, and has already started to diffuse into the slice, so that in the regions coated with aluminium diffusion takes place completely through the slice. As a result, the diffusion process produces a p-n-p slice as shown, all three zones having portions exposed on the top surface of the slice. The junctions between the zones may be covered with an oxide layer for protection, this layer being formed during the process or later.

The slice described is particularly useful for forming a controlled rectifier. For this purpose, a further n-type zone is fomed in the inner p-type zone using conventional masking and diffusion techniques, and anode, cathode and gate contacts are made respectively to the further n-type zone and to the two p-type zones.

It will be appreciated that it is not necessary to have a boron layer on the portions of the slice on which an aluminium layer is to be produced, but it is more convenient to do this than to employ further masks.

An n-p-n slice can be produced in a similar manner. Suitable slow-acting and fast-acting impurities in this case would be antimony and phosphorus respectively.

Having thus described my invention what I claim as new and desired to secure by Letters Patent is:

1. A method of forming a three-layer semi-conductor slice, comprising the following steps:

(i) masking a portion of one face of a slice of one conductivity type and covering the remainder of said one face with a first impurity of the opposite conductivity type;

(ii) subjecting the slice to a diffusion process and removing the mask;

(iii) then masking a portion of the opposite face and covering the remainder of said opposite face and at least those portions of said one face of the slice not covered by the first impurity with a second impurity of said opposite conductivity type, the second impurity having a slower rate of penetration than the first impurity; and (iv) subjecting the slice to a further diffusion process to cause the first impurity to diffuse completely through the slice only in the regions originally covered by the first impurity, so that a three layer slice is produced with all three layers terminating on one face of the slice.

2. A method as claimed in claim 1 in which the slice is n-type and the first and second impurities are aluminium and boron respectively.

3. A method as claimed in claim 1 in which the slice is p-type and the first and second impurities are phosphorus and antimony respectively.

References Cited

UNITED STATES PATENTS

| | | | |
|---|---|---|---|
| 2,836,523 | 5/1958 | Fuller | 148—188 X |
| 3,070,466 | 12/1962 | Lyons | 148—188 |
| 3,245,794 | 4/1966 | Conley | 148—187 X |
| 3,355,334 | 11/1967 | Dhaka | 148—188 X |

HYLAND BIZOT, *Primary Examiner.*